United States Patent
Patton et al.

(10) Patent No.: US 8,450,210 B1
(45) Date of Patent: May 28, 2013

(54) SEQUENTIAL STATION TOOL FOR WET PROCESSING OF SEMICONDUCTOR WAFERS

(75) Inventors: Evan E. Patton, Portland, OR (US);
Theodore Cacouris, Portland, OR (US);
Eliot Broadbent, Beaverton, OR (US);
Steven T. Mayer, Lake Oswego, OR (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 13/218,283

(22) Filed: Aug. 25, 2011

Related U.S. Application Data

(60) Continuation of application No. 12/496,120, filed on Jul. 1, 2009, now Pat. No. 8,026,174, which is a continuation of application No. 11/651,665, filed on Jan. 9, 2007, now abandoned, which is a division of application No. 10/693,223, filed on Oct. 24, 2003, now Pat. No. 7,189,647, which is a continuation of application No. 09/828,371, filed on Apr. 5, 2001, now abandoned.

(51) Int. Cl.
*H01L 21/445* (2006.01)
*C25D 17/28* (2006.01)
(52) U.S. Cl.
USPC .................... 438/675; 438/687; 257/E21.586
(58) Field of Classification Search
USPC ..................................................... 156/345.32
See application file for complete search history.

(56) References Cited

U.S. PATENT DOCUMENTS

| | | | |
|---|---|---|---|
| 5,543,028 A | 8/1996 | Herbert et al. | |
| 5,900,105 A | 5/1999 | Toshima | |
| 5,951,770 A | 9/1999 | Perlov et al. | |
| 5,985,106 A | 11/1999 | Velasquez et al. | |
| 6,017,820 A | 1/2000 | Ting et al. | |
| 6,024,856 A | 2/2000 | Haydu et al. | |
| 6,120,641 A | 9/2000 | Stevens et al. | |
| 6,174,817 B1 | 1/2001 | Doshi et al. | |
| 6,179,982 B1 | 1/2001 | Ting et al. | |
| 6,224,737 B1 | 5/2001 | Tsai et al. | |
| 6,251,250 B1 * | 6/2001 | Keigler | 205/89 |
| 6,261,433 B1 | 7/2001 | Landau | |
| 6,261,953 B1 | 7/2001 | Uozumi | |

(Continued)

FOREIGN PATENT DOCUMENTS

| | | |
|---|---|---|
| WO | WO99/41434 | 8/1999 |
| WO | WO00/32835 | 6/2000 |

OTHER PUBLICATIONS

U.S. Office Action dated Dec. 13, 2004 for U.S. Appl. No. 10/693,223.

(Continued)

*Primary Examiner* — Stephen W Smoot
(74) *Attorney, Agent, or Firm* — Weaver Austin Villeneuve & Sampson LLP

(57) ABSTRACT

Methods and apparatus are provided for processing semiconductor wafers sequentially. Sequential processes employ multi-station processing modules, where particular encompassing wafer processes are divided into sub-processes, each optimized for increasing wafer to wafer uniformity, result quality, and overall wafer throughput. In one example, a copper electroplating module includes separate stations for wetting, initiation, seed layer repair, fill, overburden, reclaim, and rinse.

16 Claims, 5 Drawing Sheets

U.S. PATENT DOCUMENTS

| | | | |
|---|---|---|---|
| 6,267,853 | B1 | 7/2001 | Dordi et al. |
| 6,290,865 | B1 | 9/2001 | Lloyd et al. |
| 6,303,551 | B1 | 10/2001 | Li et al. |
| 6,319,387 | B1 | 11/2001 | Krishnamoorthy et al. |
| 6,328,872 | B1 | 12/2001 | Talieh et al. |
| 6,334,937 | B1 | 1/2002 | Batz et al. |
| 6,344,129 | B1 | 2/2002 | Rodbell et al. |
| 6,352,467 | B1 | 3/2002 | Somekh et al. |
| 6,352,623 | B1 * | 3/2002 | Volodarsky et al. ....... 204/275.1 |
| 6,355,153 | B1 | 3/2002 | Uzoh et al. |
| 6,375,746 | B1 | 4/2002 | Stevens et al. |
| 6,376,374 | B1 | 4/2002 | Stevens |
| 6,423,636 | B1 | 7/2002 | Dordi et al. |
| 6,428,673 | B1 | 8/2002 | Ritzdorf et al. |
| 6,440,295 | B1 | 8/2002 | Wang |
| 6,478,937 | B2 | 11/2002 | Olgado et al. |
| 6,527,920 | B1 | 3/2003 | Mayer et al. |
| 6,547,937 | B1 | 4/2003 | Oberlitner et al. |
| 6,632,292 | B1 | 10/2003 | Aegerter et al. |
| 6,730,597 | B1 | 5/2004 | Lu et al. |
| 6,893,550 | B2 | 5/2005 | Dubin et al. |
| 7,189,647 | B2 | 3/2007 | Patton et al. |
| 7,229,569 | B1 | 6/2007 | Seki et al. |
| 8,026,174 | B1 * | 9/2011 | Patton et al. .................. 438/675 |
| 2002/0004265 | A1 | 1/2002 | Vepa et al. |
| 2002/0027080 | A1 | 3/2002 | Yoshioka et al. |

OTHER PUBLICATIONS

U.S. Office Action dated Oct. 14, 2005 for U.S. Appl. No. 10/693,223.
U.S. Office Action dated Apr. 21, 2006 for U.S. Appl. No. 10/693,223.
U.S. Office Action dated Apr. 1, 2002 for U.S. Appl. No. 09/828,371.
U.S. Final Office Action dated Oct. 7, 2002 for U.S. Appl. No. 09/828,371.
U.S. Office Action dated Apr. 4, 2003 for U.S. Appl. No. 09/828,371.
U.S. Final Office Action dated Oct. 29, 2003 for U.S. Appl. No. 09/828,371.
U.S. Office Action dated Oct. 3, 2008 for U.S. Appl. No. 11/651,665.
U.S. Final Office Action dated Feb. 3, 2009 for U.S. Appl. No. 11/651,665.
U.S. Office Action dated May 13, 2010 for U.S. Appl. No. 12/496,120.
U.S. Office Action dated Oct. 27, 2010 for U.S. Appl. No. 12/496,120.
U.S. Final Office Action dated Mar. 16, 2011 for U.S. Appl. No. 12/496,120.
U.S. Notice of Allowance dated May 31, 2011 for U.S. Appl. No. 12/496,120.

* cited by examiner

SEQUENTIAL STATION TOOL FOR WET PROCESSING OF SEMICONDUCTOR WAFERS

CROSS-REFERENCE TO RELATED APPLICATIONS

This application is a continuation application claiming priority from U.S. patent application Ser. No. 12/496,120, filed Jul. 1, 2009 (issued as U.S. Pat. No. 8,026,174 on Sep. 27, 2011) naming Patton et al. as inventors, and titled "SEQUENTIAL STATION TOOL FOR WET PROCESSING OF SEMICONDUCTOR WAFERS", which is a continuation application claiming priority from U.S. patent application Ser. No. 11/651,665 (now abandoned) filed Jan. 9, 2007 naming Patton et al. as inventors, and titled "SEQUENTIAL STATION TOOL FOR WET PROCESSING OF SEMICONDUCTOR WAFERS" which is a divisional application claiming priority from U.S. patent application Ser. No. 10/693,223, filed Oct. 24, 2003 (issued as U.S. Pat. No. 7,189,647 on Mar. 13, 2007) naming Patton et al. as inventors, and titled "SEQUENTIAL STATION TOOL FOR WET PROCESSING OF SEMICONDUCTOR WAFERS", which is in turn a continuation application claiming priority from U.S. patent application Ser. No. 09/828,371 (now abandoned) filed Apr. 5, 2001 naming Patton et al., and titled "SEQUENTIAL STATION TOOL FOR WET PROCESSING OF SEMICONDUCTOR WAFERS." These applications are incorporated herein by reference for all purposes.

FIELD OF THE INVENTION

This invention relates to semiconductor wafer processing technology. More specifically, it relates to processing of partially fabricated integrated circuits. Even more specifically, the invention pertains to particular methods and apparatus for sequential wet processing of silicon wafers in integrated circuit fabrication.

BACKGROUND OF THE INVENTION

In integrated circuit fabrication, wafer throughput and wafer uniformity are critical issues. Wafer wet processes such as, for example electroplating, require precise conditions i.e. anode configuration, field shape, electrolyte composition, and the like. For high throughput wafer electroplating, wafers are typically processed in parallel using apparatus with multiple similarly configured plating baths. Batch uniformity can be difficult to maintain under such scenarios, given the multitude of factors necessary to control and reproduce, as well as the tight analytical control of plating bath composition associated with integrated circuit fabrication.

Some wafer processing apparatus are designed to address uniformity limitations. One example is the SABRE™ clamshell electroplating apparatus available from Novellus Systems, Inc. of San Jose, Calif. and described in U.S. patent application Ser. No. 08/969,984, which is herein incorporated by reference in its entirety. The SABRE™ apparatus includes three separate electroplating cells and three separate post-electrofill EBR (edge bevel removal) modules. The three separate electroplating cells receive electrolyte from a central bath, which allows for improved reproducibility in electrolytic plating conditions among the three cells. Additionally, each individual cell is configured to process wafers in essentially the same manner as the other two. Each of the three separate post-electrofill EBR modules may be employed to perform various functions such as edge bevel removal, backside etching, and acid cleaning of wafers after they have been electrofilled by one of the electroplating cells.

Although the SABRE™ tool does provide improvement in reproducibility during wafer processing, in consideration of the aforementioned issues, improved methods and apparatus could be useful. Improvement in wafer throughput and process uniformity can be rationalized in terms of the environment that a wafer is exposed to during processing. For optimum process (and thus product) uniformity in a given batch of wafers, it is logical to expose each wafer to the same environment rather than a similar environment as in parallel processing systems. This implies that sequential processing rather than parallel might offer advantages in wafer uniformity. With dedicated parallel process stations, there are separate, unique process "paths" that a wafer can take, thus increasing the variability in the finished product. Also, in typical parallel processing systems a robot arm assembly is used for wafer handling during processing. For these systems, although multiple wafers are processed simultaneously, individual plating and post-plating operations (unit operations) do not generally require the same processing time frames, often robotics handling events and software logic are difficult to balance and wafer throughput is hard to fully optimize.

There is an added dimension to the current wafer throughput and uniformity paradigm. Increasingly, technology advances in integrated circuit fabrication dictate that distinct fabrication processes are better executed in stages, rather than in one step. For example in a damascene-processing scenario, a process such as electroplating is not always simply a single step deposition process, but rather involves a set of sub-processes. In copper electroplating, after a thin seed layer of copper is applied to a wafer, copper electrofill is performed to fill the interconnect regions of the eventual circuit. This is typically done under very specific rate, electrolyte, and electric field conditions to minimize defects in the portion of the copper layer intended to form the interconnects in trenches and vias. Finally, copper is deposited at a higher deposition rate, typically under less stringent conditions, to cover the copper interconnects and fill any larger incompletely-filled features. Ideally, electroplating is performed under distinctly different conditions (temperature, electrolyte composition, electric field, etc.) at different sub-stages of the overall operation. In a conventional apparatus employing a single plating cell in which the wafer is stationary, it is difficult to attain optimal conditions for each of these electrodeposition sub-processes. Some flexibility is possible but requires changing the electrolyte composition and plating cell hardware configurations, both with associated costs in time.

Additionally, there are other throughput and uniformity issues associated with wafer processes performed before, during, and after electroplating. Non-uniform wetting fronts can cause defects in the deposited metal layer. Due to limited PVD capabilities or oxide formation, seed layers often need to be repaired before electroplating can commence. Commonly it is desirable to recover electrolyte in a rinsing step. Also, improved electropolishing techniques are being developed and used more often to supplement or replace chemical mechanical polishing. It would be advantageous to have an apparatus and methods that incorporate these processes into a single system to save time and thus optimize throughput.

What is needed therefore is improved technology for processing of semiconductor wafers in integrated circuit fabrication.

SUMMARY OF THE INVENTION

The present invention provides methods and apparatus for processing semiconductor wafers sequentially. More particularly this invention provides improved wafer throughput, process and hardware flexibility, and wafer to wafer reproducibility. It is based on sequential, multi-station processing in modular format.

One aspect of the invention is a method of exposing each wafer of a set of wafers to the same process "path" as it moves through sequential stations. This aspect of the invention yields improved wafer to wafer uniformity. Each path has multiple stations, each of which performs a different sub-process, such as initiation and various stages of metal deposition. Metals for deposition on wafers include copper, silver, gold, aluminum, tin, lead or any similar material that can be deposited from a liquid or gaseous media. In one approach, high productivity is achieved by using essentially two wafer handler sets, one to move wafers between wafer carriers and the processing environment, and one to index wafers from one station to the next within the processing environment. The use of two handler sets allows a better balance of handling tasks, and productivity is not constrained by the speed of a single robot addressing many stations and many carriers. The invention also obviates the need for unnecessary hardware replication and cost associated with dedicated parallel process stations. In the sequential design, many process support resources (e.g. gas/fluid delivery, power supplies, pumps, etc.) can be shared between stations. Additional handling efficiencies and throughput can be gained if the wafer clamping apparatus or carrier (e.g. Clamshell in the Sabre tool) travels with the wafer so that the function of clamping/unclamping is executed a minimal number of times.

Another aspect of this invention pertains to a method of associating a set of unique sub-processes, each part of a single encompassing process, into a module for sequential execution. For example as mentioned above, with copper electroplating (an "encompassing process" or unit operation), there may be a number of unique wet process conditions or sub-processes (e.g., wetting, initiation, seed layer repair, fill, overburden, reclaim, and rinse) desired for optimum deposition quality and throughput in the overall metal electrodeposition process. The invention can be embodied in a carousel (radial) module format with stations for each sub-process located along the perimeter of the carousel. A wafer is then exposed sequentially to each sub-process station or "environment" of the encompassing process. Alternatively, a linear arrangement can be used for each sub-process, with a wafer "shuttle" between each sub-process performing a hand-off from one step to the next. Such an arrangement can have the additional advantage in that the sub-process stations can be modular and allow the number of stations and their function to be easily rearranged.

Another aspect of this invention pertains to methods of electroplating metal on a semiconductor wafer. With respect to the aforementioned encompassing processes and associated sub-processes, these methods may be characterized by first processing the semiconductor wafer in a first station of a plurality of separate stations using a first sub-process chosen from a plurality of distinct sub-processes associated with metal electroplating. Then processing the semiconductor wafer in a second station of the plurality of separate stations using a second sub-process, distinct from the first sub-process, chosen from the plurality of distinct sub-processes associated with metal electroplating; wherein the plurality of distinct sub-processes associated with metal electroplating include two or more of the following: wetting, initiation, seed layer repair, fill, overburden, reclaim, and rinse. Particularly important for modern semiconductor deposition quality demands, the invention provides separate cells with uniquely configured current shaping apparatus.

As mentioned, the invention finds particular use in the context of copper electroplating in damascene processing for integrated circuit fabrication. In this case for example, a wafer could be sequentially exposed to surface wetting, initiation, seed repair/deposition, feature fill, overburden, and rinsing/plating solution reclaim sub-processes within a single modular apparatus. Of course the invention can be used for other wafer processes, wet or other, each in a designated module.

Another aspect of the method involves arrangement of the aforementioned modules in a cluster tool. This aspect of the invention describes a method for sequential processing of a semiconductor wafer, the method comprising processing the semiconductor wafer in a first plurality of distinct stations in a first module of a plurality of modules in a cluster tool, the first module performing a first integrated circuit fabrication process encompassing multiple sub-processes, wherein each station of the first plurality of distinct stations is uniquely configured to perform its own sub-process, and wherein the first integrated circuit fabrication process is selected from the group consisting of: electroplating, electropolishing, rinsing, annealing, spin coating, electroless plating, activation processes for electroless plating, metal chemical etching or polishing, edge bevel removal, wafer backside rinsing and etching, frontside rinsing and cleaning (e.g. with a dilute acid), and chemical mechanical polishing. Then transferring the semiconductor wafer from the first module to a second module in the cluster tool; and processing the semiconductor wafer in a second plurality of distinct stations in the second module of the plurality of modules, the second module performing a second integrated circuit fabrication process encompassing multiple sub-processes, wherein each station of the second plurality of distinct stations is uniquely configured to perform its own sub-process, and wherein the second integrated circuit fabrication process is different from the first integrated circuit fabrication process. Generally, the invention can be applied to sequentially divide any process employed in integrated circuit fabrication, for example wet etching, electroplating, electropolishing, rinsing, annealing, spin coating, electroless plating, activation processes for electroless plating, metal chemical etching or polishing, edge bevel removal, wafer backside rinsing and etching, frontside rinsing and cleaning (e.g. with a dilute acid), and chemical mechanical polishing. Apparatus of the invention can be used for electroplating a metal on a semiconductor wafer, the apparatus comprising a module containing a plurality of separate stations; wherein the plurality of separate stations is configured to perform a plurality of distinct sub-processes associated with metal electroplating; and a mechanism for transporting the semiconductor wafer to and from each station of the plurality of separate stations, wherein the plurality of distinct sub-processes associated with metal electroplating includes two or more of the following: annealing, wetting, initiation, seed layer repair, fill, overburden, reclaim, and rinse, backside etching, frontside cleaning, and edge bevel metal removal.

Again, any wafer wet process can be performed on such apparatus, therefore such an apparatus for sequential wet processing of a semiconductor wafer comprises a module for performing a process encompassing multiple sub-processes, which module contains a plurality of separate stations; wherein the plurality of separate stations is configured to perform a plurality of distinct sub-processes associated with wet processing in integrated circuit fabrication. And the apparatus has a mechanism for transporting the semiconductor wafer to and from each station of the plurality of separate stations; wherein each of the plurality of separate stations is uniquely configured to perform its own sub-process chosen from the plurality of distinct sub-processes associated with wet processing in integrated circuit fabrication, which process is selected from the group consisting of electroplating, electropolishing, rinsing, wet etching, spin coating, electroless plating, activation processes for electroless plating, etching, edge bevel removal, wafer backside rinsing and etching, frontside rinsing and cleaning (e.g. with a dilute acid), chemical mechanical polishing and the like.

Other aspects of this invention pertain to systems for sequential processing of wafers which employ a set of the aforementioned modules arranged in a cluster, each module providing an associated encompassing process (wet or other). At least one of the modules includes a sequential collection of stations. For example, one cluster may include an electroplating module having a sequence of separate electroplating stations, a rinse module having a sequential collection of rinse/etch stations, and an electropolishing module having a sequential collection of electropolishing stations. Each station performs a sub-process associated with the process of its respective module. This aspect of the invention extends the utility of the invention to include not only wet processing, but also other wafer processes. In accordance with this invention, each of these unit operations may be divided into a series of sub-processes (and associated stations) for sequential processing. In this way, wafers can be processed more fully in a single system, rather than being shuttled to separate systems. This aspect of the invention also increases throughput and decreases the overall footprint of equipment needed to process wafers, thus saving time and crucial production facility space. Further gains in space reduction can be obtained by stacking the aforementioned process clusters on top of each other with an apparatus that permits wafer transfer vertically to each cluster, or where each cluster is a duplicate of the first and therefore affords parallel processing capability for higher throughput. Preferably, the apparatus is a system for sequential processing of a semiconductor wafer, the system comprising a plurality of modules, each module performing a distinct process encompassing multiple sub-processes, and each module comprising a plurality of separate stations; wherein the plurality of separate stations is configured to perform a plurality of sub-processes associated with integrated circuit fabrication; and a mechanism for transporting the semiconductor to and from, each of the plurality of separate stations associated with each module; wherein each station of a given module is uniquely configured to perform its own sub-process, which sub-process is part of one of the encompassing processes, which processes are selected from the group consisting of: electroplating, electropolishing, rinsing, annealing, spin coating, electroless plating, activation processes for electroless plating, metal chemical etching or polishing, edge bevel removal, wafer backside rinsing and etching, frontside rinsing and cleaning (e.g. with a dilute acid), and chemical mechanical polishing and the like. These and other features and advantages of the present invention will be described in more detail below with reference to the associated figures.

BRIEF DESCRIPTION OF THE DRAWINGS

The following detailed description can be more fully understood when considered in conjunction with the drawings in which.

DETAILED DESCRIPTION OF THE PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. For example, one aspect of the apparatus of the invention is depicted as a radial (carousel) arrangement; this aspect of the invention could be embodied in a linear (straight track) arrangement, or some combination or variation of either arrangement. In some descriptions herein, well-known processes, procedures, and components have not been described in detail so as not to unnecessarily obscure aspects of the present invention.

One method of the invention features electroplating a metal such as copper on a semiconductor wafer by sequentially exposing the wafer to distinct sub-processes of the overall electroplating process. These are discussed in more detail in U.S. patent application Ser. Nos. 09/410,170 and 09/515,414 by Mayer et al, which are herein incorporated by reference. In one embodiment pertinent to copper electroplating in a damascene process scenario, these sub-processes would include but would not be limited to: wetting, initiation, seed layer repair, fill, overburden, reclaim, edge bevel removal, rinse and dry. One embodiment of the invention incorporates the sum of these sub-processes (each having their own sub-process station) in a single electroplating module. Examples of single sub-process tools are the Sequel™ or Altus™ multi-station, sequential deposition (MSSD) tools, available from Novellus Corporation of San Jose, Calif. Current technology does not provide methods or apparatus for sequential processing of a wafer with exposure to distinct sub-processes of the overall electroplating process within one tool. For the reasons outlined in the background section above, this invention provides improved wafer to wafer reproducibility and throughput.

A particular advantage of the invention is that individual stations are specifically configured to provide a unique sub-process and need not handle two or more sub-processes, which could require reconfiguration during wafer processing and result in neither sub-process being optimized. The reconfiguring processes present in conventional apparatus can account for significant "idle" time in wafer processing. For clarity, each of the aforementioned sub-processes for copper electroplating in a damascene process will be described below in conjunction with the figures to illustrate the utility of the invention over conventional technology. Of course the invention embodies other wafer processes each encompassing a set of sub-processes, as would be understood by one skilled in the art.

Figure 1:
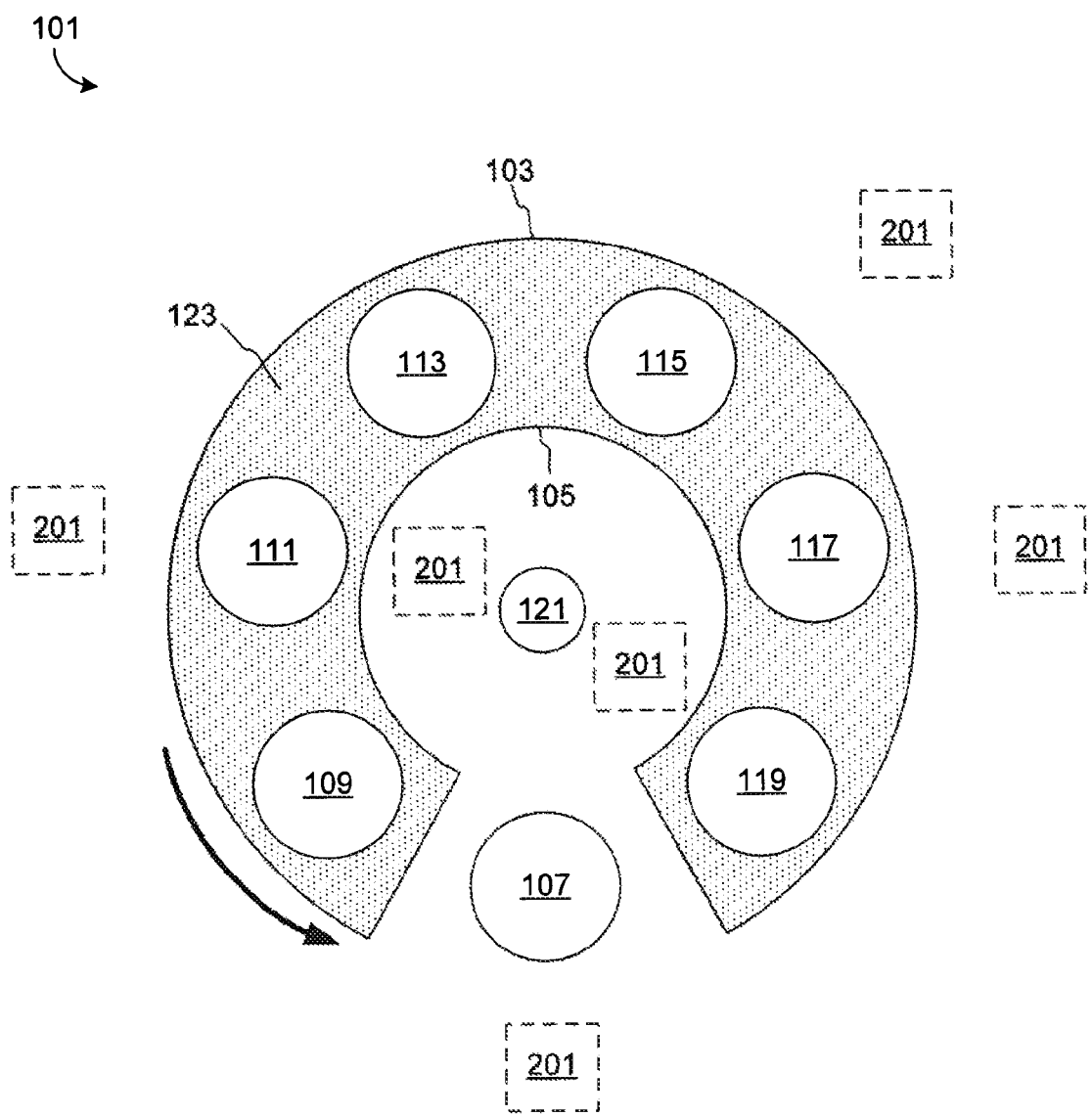
FIG. 1 depicts a top view of a carousel design for a module with process stations.

As depicted in FIG. 1 (top view), one embodiment of the invention uses a single rotation stage (carousel) module 101, which has an outer perimeter 103 and an inner perimeter 105. Carousel 101 may have associated with it, multiple wafer holding/handling assemblies as depicted by dashed-line boxes, 201. These may be simple or complex mechanisms, depending upon the requirements of the particular module. In some embodiments, it may be necessary to employ robot arms that are actuated using sophisticated control systems. The wafer holding/handling assemblies can collectively be attached to another rotatable carousel situated above, below, or concentric to 101 (either within 105 or outside of 103). Alternatively, the assemblies can be individually oriented around outer perimeter 103 or inner perimeter 105, or both as depicted. Additionally, the assemblies could be configured in any combination of the aforementioned arrangements to maximize handling efficiency, which relates to overall processing throughput. Each of the assemblies is capable of delivering a wafer to one or more of a loading/unloading station 107 and a series of sub-process stations 109-119. The wafer holding/handling assemblies are designed to hold a wafer while making electrical contact to its periphery, in a manner analogous to that employed in the SABRE™ clamshell apparatus. The wafer holding/handling assemblies are radially positioned about a central axis 121 and each can rotate an individual wafer. Electrical current to the wafer holding/handling assemblies may be supplied through a rotary union. Delivery components of each wafer holding/handling assembly can be of different configuration or the same, depending on the particular function of each assembly. For instance, one assembly may function during an electroplating process, in which a wetted wafer need only be lifted vertically along an axis perpendicular to its intended deposition surface, in and out of a plating bath electrolyte. Alternatively, another assembly may function during a wetting process, in which the wafer needs to be delivered to a wetting bath solution so that the surface intended to be wetted enters perpendicular to, or at a specified angle relative to, the surface of the wetting solution. Optimally, but not necessarily, delivery components of an assembly that can perform movements compatible with all sub-processes is desirable.

As mentioned, located around central axis 121 are a loading/unloading station 107 and a series of process stations 109-119. In one embodiment, carousel 101 is a single large plating bath (with plating electrolyte 123) which encompasses all but station 107. In this embodiment, station 107 is designed for loading wafers entering sequential processing carousel 101, and unloading fully processed wafers leaving sequential processing carousel 101. Stations 109-119 are designed to execute various sub-processes associated with an encompassing process, in this case electroplating. During each sub-process, the wafer (contained in its associated holder/handler assembly) can be either in the bath or out of the bath. During operation, a wafer enters carousel 101 at location 107, at which time the wafer holder/handler assembly is sealed and electrical contact is made. Carousel 101 rotates with respect to the wafer holder/handler assembly (in this case counter clockwise as indicated by the arrow) to situate the wafer over station 109, at which time the wafer holder/handler assembly moves downward into the bath. After rotation of 101, all the wafer holder/handlers are indexed to the next processing station; except one, which now by default, positions its finished wafer (having been processed through all the stations) over loading/unloading station 107 for removal. The rotation event occurs after all stations have finished their respective functions, and all stations operate simultaneously between rotations for optimum wafer throughput. Each wafer can be rotating about its center axis as it enters the bath or current is turned on, or both. The current can be either constant or vary, during the time that a wafer and its associated holder/handler assembly is in a station requiring current.

In this case, where a common bath is used, it is not generally required that a wafer (once immersed) be removed from the bath during movement from one station to the next. For example, after a wafer has been subjected to a particular set of plating conditions (anode configuration, current, electrolyte flow) in one station, upon reaching the next station, the current is turned on again, and the plating process continues under a new set of plating conditions (anode configuration, current, electrolyte flow) in the next station, and so on.

Figure 2A:
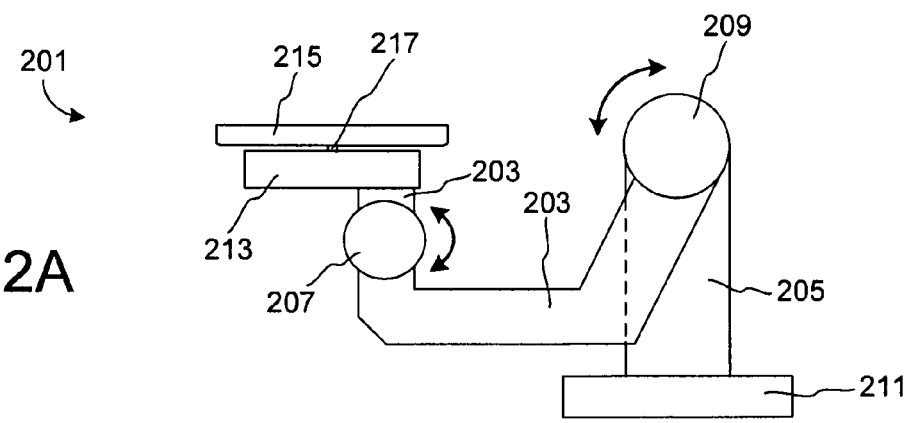
FIGS. 2A-C depict a wafer holding/handing assembly and some relative positions used during processing of a wafer.
Figure 2B:
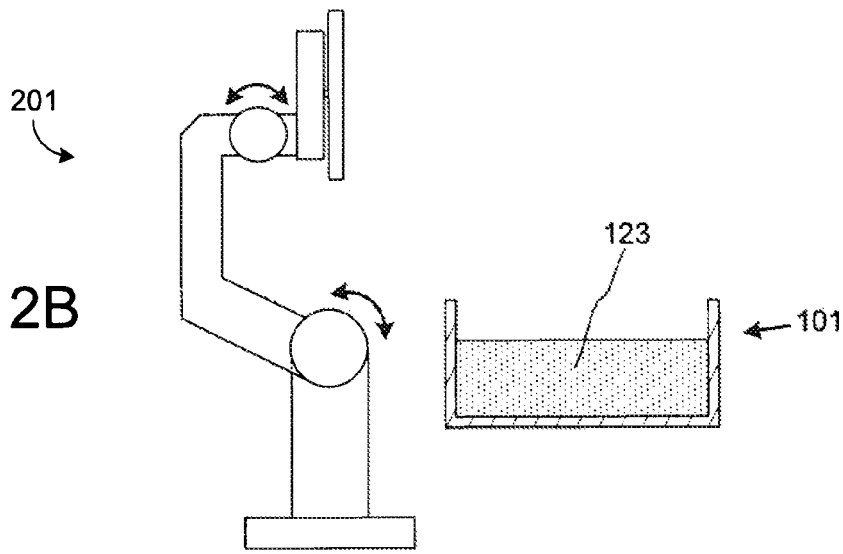
Figure 2C:
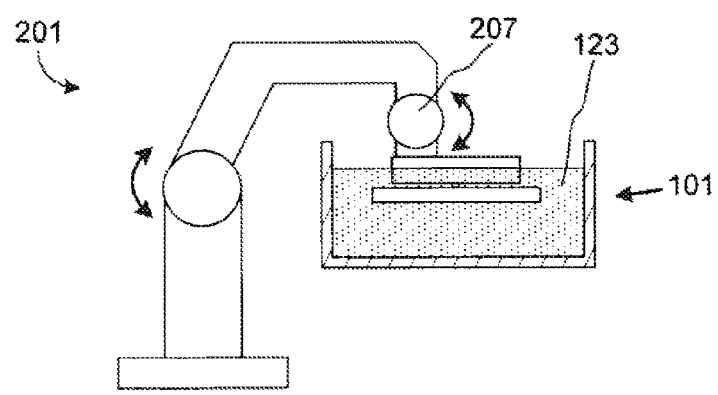

The rotation event, which indexes the wafer from one station to another, can take place relatively rapid depending upon the process and sub-processes. For a specific copper electroplating process in which all stations share a common electrolyte, the indexing preferably takes no more than about 20 seconds, more typically, between about 1 and 20 seconds, and most preferably between about 2 and 5 seconds. This keeps the total "idle" time of the wafer to a minimum of between about 6 and 30 seconds. In alternative embodiments, one or more of the stations contain separate plating baths. This allows one to optimize the plating bath chemistries for particular sub-processes. In this case, a wafer may be briefly raised, rinsed or spun before going to the next station. The spinning is done to remove electrolyte from the wafer, to recover electrolyte, and to reduce cross contamination of the electrolyte compositions of separate baths. The rinsing furthers the reduction of bath cross contamination. For example one bath contains an electrolyte composition which includes an organic additive to enhance a conformal process, while another contains an electrolyte composition designed specifically to exclude the organic additive. The baths may contain different anions (metal ions), cations, complexing agents (EDTA, $NH_4^+$, NTA, pyrophosphate, etc.) or additives. As another possible example, the first bath may contain an electroless plating bath (for depositing a conformal metal film into the features and onto the field region thereby enabling filling success in the next bath), the second bath may be a bath optimized for bottom-up feature filling, and a third bath may contain a different electrolyte and additives optimized for high current density overburden plating. The wafer may be spin dried within these modules to recollect bath fluids and coarsely rinsed the part prior to moving from the various plating baths (to eliminate undesirable cross-bath contamination). Alternatively, the wafer may enter a module which more fully rinses (and possibly dries) the wafer entirely between the various plating baths. FIGS. 2A-C depict a side view of an example wafer holding/handling assembly 201 in various positions used during processing of a wafer in a module of this invention. Assembly 201 represents one embodiment of the invention, and is not limiting. FIG. 2A shows assembly 201 having essentially two major functional parts. First, a delivery component that has a movement arm assembly made up of arms 203 and 205. Arm 203 has an associated pivot joint 207, and connecting arm 203 and 205 is a pivot joint 209. Movement arm 205 is joined to a base 211, which in some embodiments can rotate about an axis parallel with the vertical dimension of arm 205. Not shown are drive components for the movement arm assembly. These can be small motors in pivot joints 207 and 209 (and base 211), or an arrangement of gears, or a belt and pulley system, or the like. Second, there is a wafer clamp/rotation component made of a head 213 and a wafer clamp 215. Head 213 is an electrolyte-impermeable casing that houses a motor that rotates wafer clamp 215, via a drive shaft 217 which connects 213 and 215. More detail of the wafer clamp/rotation component will be provided below in conjunction with FIG. 2D.

In FIG. 2A, the wafer clamp/rotation component of wafer holding/handling assembly 201 is shown in a horizontal position (parallel with base 211) from which a wafer can be loaded horizontally into wafer clamp 215. Due to the rotatable nature and location of pivot joints 207 and 209 on movement arms 205 and 203, the wafer clamp/rotation component can be oriented in many positions of varying angle and distance relative to base 211. Any of these positions can be appropriate for efficient wafer loading/unloading and processing steps. FIG. 2B shows assembly 201 in another position, where the wafer clamp/rotation component is vertical, relative to carousel 101 (containing electrolyte 123). The wafer clamp/rotation component can be lowered into the plating bath from the position in FIG. 2B, as depicted in FIG. 2C. Note that the wafer clamp/rotation component is submersible. Again, due to the rotatable nature of the pivot joints, particularly 207 in this case, the wafer can be lowered into electrolyte 123 at various entry angles, or be held above the electrolyte at various angles. This feature is important for various sub-processes that take place in plating module 101. For example, when wetting the wafer it is sometimes desirable to introduce the wafer at an angle perpendicular to (or at some other angle relative to) the wetting solution surface. The angle may be chosen to facilitate wetting for example. Also, when a wafer is to be rinsed it is sometimes desirable to have it positioned vertically or at some angle relative to a rinse catch basin to facilitate rinsing and reclaim of rinse solution and electrolyte.

Figure 2D:
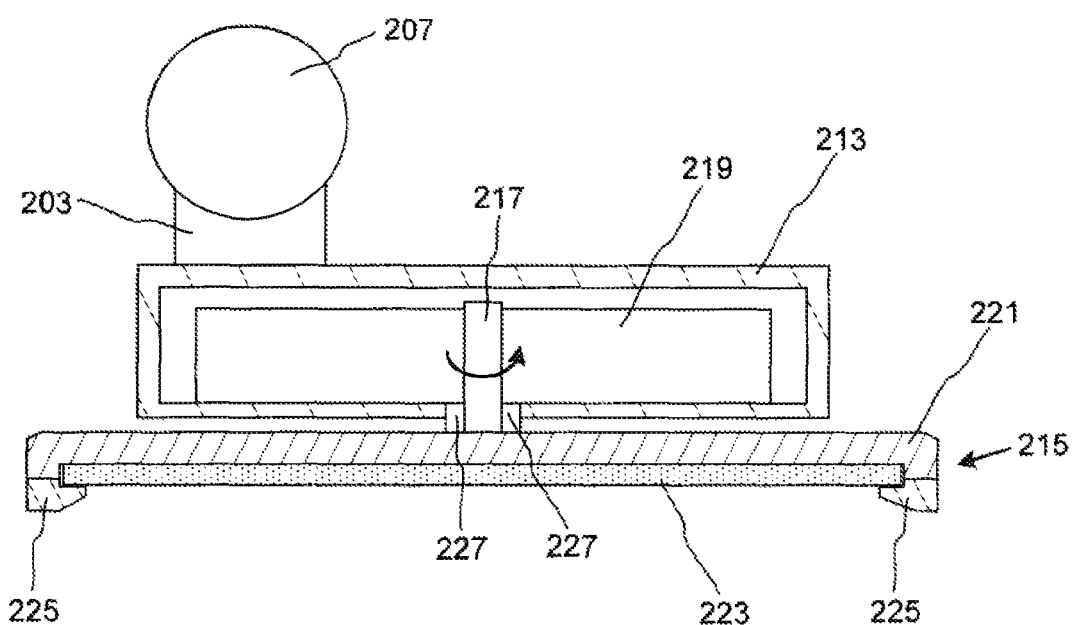
FIG. 2D is a more detailed cross-sectional diagram of the wafer clamp/rotation component of the holding/handing assembly depicted in FIGS. 2A-C.

FIG. 2D shows a more detailed cross-sectional diagram of the wafer clamp/rotation component of holding/handling assembly 201 including pivot joint 207 and a portion of movement arm 203. The wafer clamp/rotation component of holding/handling assembly 201 is preferably a low-profile component to minimize displacement of bath solutions and facilitate range of movement for wetting and rinsing processes. Head 213 is a sealed unit that houses a motor 219, which has a rotating drive shaft 217. In this example, motor 219 is attached to an interior surface of head 213, and is typically an electric motor (for clarity, electrical sources not depicted). Alternatively, head 213 could be of an open configuration with motor 213 being a simple "paddle wheel" or hydraulic motor driven by a specific flow characteristic of the bath electrolyte. In either case, all components exposed to electrolyte would be made of material or coated with material resistant to the electrolyte medium. Drive shaft 217 connects motor 219 with wafer clamp 215. Wafer clamp 215 has two main parts, a base 221 for supporting wafer 223, and a clamping component 225. Wafer clamp 215 is made of electrically conductive material and electrical contact is made through rotary union 227. Rotary union 227 also has a seal component to keep electrolyte out of head 213. For electric field considerations, head 213 and the surfaces of 215 not contacting wafer 223 are coated with an electric field suppressing/insulating material. Wafer clamp 215 (and the stations of sequential processing module 101) can be configured to accommodate standard wafers of 100, 150, 200, or 300 millimeters. Clamping component 225 can be a continuous ring with tight contact with wafer 223 so as to protect the backside of the wafer. Alternatively, 225 can be a series of clamps and an o-ring or gasket (not shown) is positioned between wafer 223 and base 221 to protect the backside of wafer 223. Also there is a component (not shown) for moving the clamp from an "open" position (not shown) to receive wafer 223, to a "closed" position to hold wafer 223 as depicted.

Finally, the wafer clamp/rotation component of assembly 201 can be detachable from the delivery component of assembly 201. In this case the wafer clamp/rotation component of assembly 201 can be "shuttled" from station to station with any number of delivery devices. This also gives flexibility in delivery and handler device design. Some stations may need the capability of flipping the wafer clamp/rotation component, or providing specialized electrolyte flow or heating elements. Others stations may require that the wafer be tilted with respect to the bath electrolyte surface during entry and/or during processing.

Figure 3:
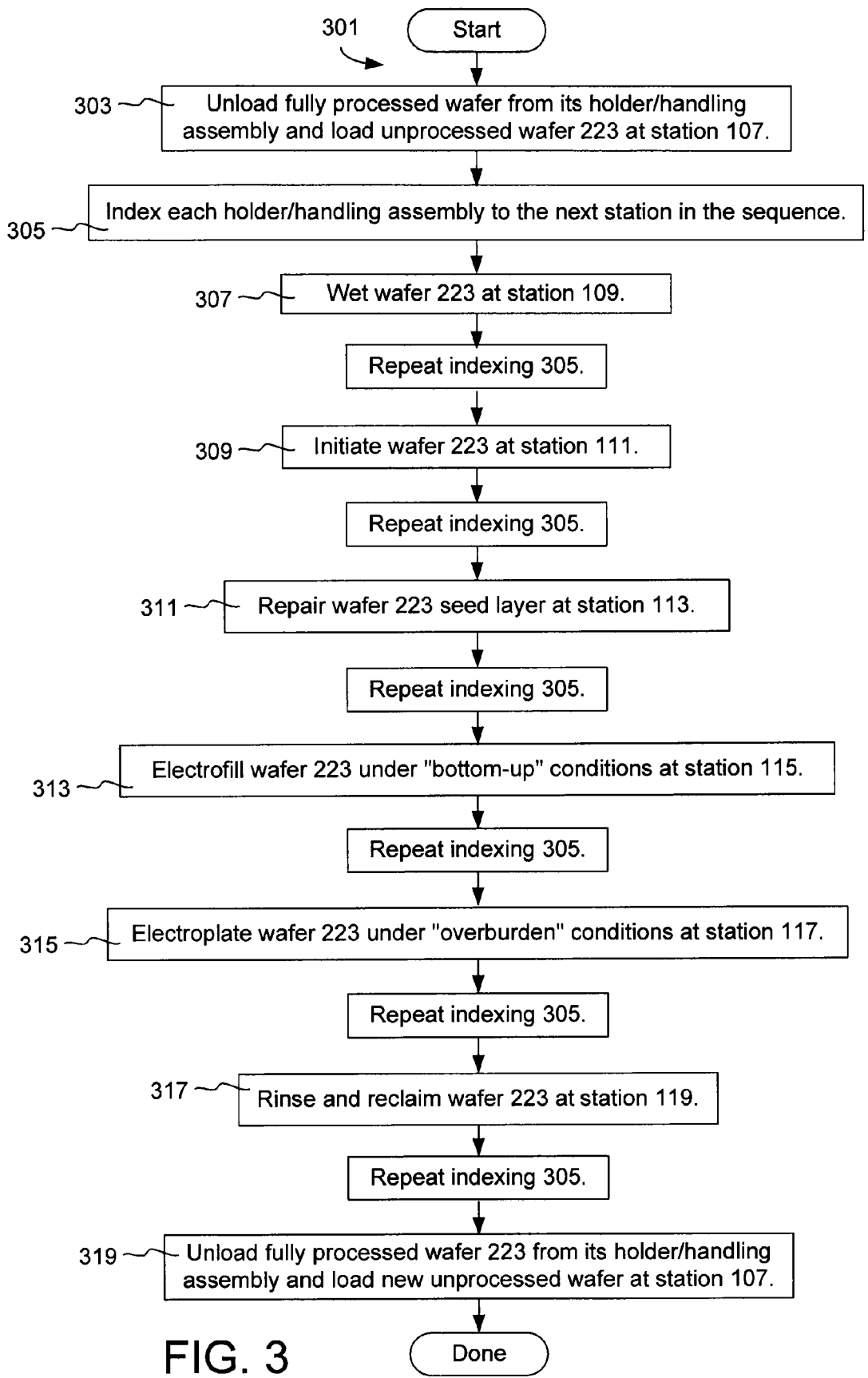
FIG. 3 is a flowchart of a preferred embodiment of the method of sequential wet processing of a wafer during electroplating.

FIG. 3 is a flowchart of a preferred embodiment of the method of sequential wet processing of a wafer during electroplating. The following description of this embodiment of the method is made with reference to FIG. 3 and FIG. 1, and assumes the electroplating process is in progress and that all stations of module (carousel) 101 are processing wafers. Also for reference, hypothetical wafer 223 from FIG. 2D is cited. In this example, plating module 101 has seven stations, 107-119, although any number of stations can be employed in the invention, depending on the process involved and how many sub-processes it encompasses. Again, the apparatus of the invention can embody alternative architectures like straight track systems, or combinations of linear arrangements and radial arrangements.

Copper electroplating process 301 begins with a first sub-process, 303, unloading a fully processed wafer from a holder/handling assembly at station 107 and loading unprocessed wafer 223. Wafer 223 in this case has a pre-applied copper seed layer via PVD (physical vapor deposition) or CVD (chemical vapor deposition). Once the wafer exchange has taken place, carousel 101 rotates counterclockwise (in this case) to index all of the holder/handling assemblies over their next respective stations, see 305. This action puts wafer 223 over wetting station 109. It is optimal to introduce only one wetting front to the wafer during 307. Wafer 223 may be wetted in any number of ways. For example, wafer 223 may be introduced horizontally to a wave of wetting solution in a bath. Preferably, wafer 223 may be introduced into a wetting bath at an angle relative to the surface of the wetting solution. This angle is preferably between about 0 and 20 degrees from the plane of the wetting solution surface, more preferably between about 1 and 15 degrees from the plane of the wetting solution surface, and most preferably between about 2 and 7 degrees from the plane of the wetting solution surface.

The wafer is typically wetted without application of substantial current (wetting with current is referred to as "hot entry"). In other words, no current is applied until after the wafer has been effectively wetted. (No current can actually pass until the wafer contacts the bath and a current path is established). Initiating the plating process is often accomplished by either 1) controllably flowing current through the plating circuit until plating commences (with the potential between the wafer and a reference electrode in solution controlling the plating rate) or by 2) sensing the point of entry (by measuring the circuit resistance for example), and turning current on shortly (0.1 to 5 seconds) after entry (so called "triggered entry"). Triggered entry is disclosed in U.S. patent application Ser. No. 09/727,431. Rotation rate, bath type and wetting characteristics, design of the wafer holder, and rate at which the wafer enters the bath are also important criteria for effective wafer wetting.

After wafer 223 is wetted, carousel 101 again rotates counterclockwise to index all of the holder/handling assemblies over their next respective stations, repeating 305. Next comes the second sub-process, initiation, 309, at station 111. Initiation pertains to the copper seed layer described above. In initiation, any copper oxide that has formed on the seed layer is removed. This can be done using chemical etching, electrolytic reduction of the oxide to copper metal, use of an electroless reduction chemistry or reducing redox couple, electroless plating, or reduction/annealing in a hot hydrogen gas containing atmosphere. In electrolytic reduction, a redox reaction under basic pH conditions is preferably used to reduce the copper oxide to copper metal. If electroless reduction is used for initiation, the same station could be used for wetting given the excellent wetting properties of typical electroless reduction solutions. In the initiation sub-process, holding the wafer vertical or at some angle relative to horizontal may be desired; commonly the amount of initiation solution to be used is kept to a minimum, and thus it can be applied via spray, dripping, or other low-volume application technique. Initiation occurs almost instantaneously.

After wafer 223 is initiated, carousel 101 again rotates counterclockwise to index all of the holder/handling assemblies over their next respective stations, repeating 305. Next comes a third sub-process, seed layer repair, 311, at station 113. In seed layer repair, any discontinuities in the seed layer that exist are filled to ensure that the seed layer is an essentially continuous layer of copper over the entire plating surface of the wafer. Seed layer repair can be done in electroless fashion using reduction chemistry to plate metal or electrolytically using conformal plating electrolyte combination. A wide variety of electroless solutions can be used for these operations as known in the art. Typical electroless solution contain low copper concentrations (0.5 to 10 g/L $Cu^{+2}$), and a reducing agent (formaldehyde or Glyoxylic acid, 1 to 20 g/L). Preferably, the electrolyte employed for electrochemical seed repair has a very small exchange current density (large overpotential) for metal deposition. Therefore, the metal concentration tends to be low (0.5 to 10 g/L $Cu^{+2}$), and the bath contains strong polarizing agents (e.g. suppressing additives such as polyethylene and/or polypropylene glycol and their block and random co-polymer derivatives with ppm concentrations of halide ion, benzotriazole, or thiourea), and metal complexing compounds (e.g. $NH_4^+$, EDTA, NTA, pyrophosphate). Alternatively, a metal seed layer can be repaired using electroless plating solution. A wide variety of solutions are known in the art, such as those disclosed in U.S. Pat. No. 6,193,789 by Homna et. al, U.S. Pat. No. 5,965,211 by Konda et. al, U.S. Pat. No. 5,897,692 by Kotsuko et. al, and U.S. Pat. No. 4,877,450 by Brasch.

Seed repair involves deposition of some amount of copper. Depending upon the quality and thickness of the seed layer, the amount of copper deposited may vary widely. In a specific embodiment, the seed repair operation deposits about 50-200 Å angstroms of copper and takes between about 10 and 120 seconds, more preferably between about 20 and 90 seconds- .fter seed repair on wafer 223 is complete, carousel 101 again rotates counterclockwise to index all of the holder/handling assemblies over their next respective stations, repeating 305. Next comes a fourth sub-process, electrofill, 313, at station 115. In electrofill or "fill", copper is electroplated to fill high aspect ratio features using "bottom up" conditions. In this case, organic additives such as suppressors and accelerators are combined with copper salts in the electrolyte to slow copper deposition rate at the edges of the via and trench features etched into the dielectric layer. This effectively enhances the copper deposition rate at the bottom of those features and thus they fill with electrodeposited copper from the bottom up. To increase conductivity, the electrolyte may also include some concentration of acid (e.g., sulfuric acid). In a specific example, the electrolyte employed in the fill operation contains between about 5 and 30 g/L copper ion, between about 8 and 180 g/L acid, between about 300 and 3000 ppm of a suppressor (e.g. 1000 to 100,000 molecular weight polyethylene and/or polypropylene glycol and their block and random co-polymer derivatives with ppm concentrations of halide ion) and between about 2 and 50 ppm of an accelerator (e.g. mercaptopropane sulfonic acid (MPS), N,N-dimethyl dithiocarbamic acid (3-sulfopropyl) acid (DPS), and dimercaptopropane sulfonic acid (SPS), see Table 1 below. Preferably, the fill operation is conducted at a current density of between about 3 and 33 $mA/cm^2$. In a typical example, fill takes about between about 1 and 60 seconds, more preferably between about 5 and 45 seconds, and most preferably between about 10 and 30 seconds.

TABLE 1

| Examples of Plating Bath Accelerators | |
|---|---|
| H—S—$CH_2$—$CH_2$—$CH_2$—$SO_3$H | MPS |
| ($HO_3$S—$CH_2$—$CH_2$—$CH_2$—S)$_2$ | SPS |
| ($CH_3$)$_2$N—C(S)—S—$CH_2$—$CH_2$—$CH_2$—$SO_3$H | DPS |

Importantly, the various separate plating stations of the invention may be uniquely configured to maintain a time-averaged uniform deposition rate over the wafer which compensates for any electrical "terminal effects" (associated with the conduction of electricity from the periphery of the wafer to the center when the copper film is thin). This is significantly different than conventional plating tool capability, where the final film uniformity is a product of an average film deposition rate resulting from changes in the terminal effect over the entire deposition period. In typical parallel processing tools (where a single plating configuration is commonly used), the initial deposition rate (when the film is thin) is higher near the electrical contact terminals (where resistance is smallest) usually on the outer edge of a wafer. Therefore, if a uniform overall film deposition is desired, the current density (plating rate) must be higher in the center of the wafer during a latter part of the deposition process. If the current density is not uniform during the electrofilling stage, void free bottom-up filling may not occur on some portions of the wafer. This becomes even more of a problem with the transition to larger wafer sizes. To address this, conventional apparatus may rely on complicated and time consuming reconfiguration of plating conditions to ensure an optimum current density distribution over the wafer surface at all times as described in U.S. patent application Ser. No. 09/537,467 filed on Mar. 27, 2000 entitled "Method of apparatus for uniform electroplating of integrated circuits using a variable field shaping element.", naming S. Mayer et. al as authors and incorporated herein in its entirety. The flexibility afforded by using multiple uniquely-configured stations in accordance with this invention can provide a uniform deposition rate when the copper film is initially thin. The flexibility arises by using different anode designs and/or field shaping elements in different stations within the module. These design choices provide variation in the current density distribution across the wafer surface. Early in the process, when the copper film is thin, one would want focus current density to the center of the wafer by field shaping, thereby compensating for the terminal effect. Later in the process, when the potential difference between the edge and center of the wafer face is minimal, a more uniform current distribution is desirable. In one approach, the anode can be mostly encased in a plastic material, except for an opening in the center region of the active face of the anode. The size of the opening and the distance between the opening and the wafer can be varied for the desired effect. This in effect creates a "virtual anode", reducing terminal edge effects. When necessary to adjust the deposition profile, the wafer is simply moved to the next station, specifically designed for the desired deposition profile.

Additionally, each station can have unique plating bath flow nozzles which direct electrolyte either normally to, or tangential to, the wafer surface. In this way each station can more optimally control the primary (e.g. anode size, spacing, field shaping), secondary (e.g. charge transfer kinetics through bath makeup and current density), and tertiary (e.g. diffusion/flow control) current distribution required for each sub-process in the encompassing plating process. After the film thickens to appropriately fill the vias, trenches, and any other small features, the wafer can be moved on to another station that is designed to deposit a uniform film on top of the base film. In this way, an encompassing process is divided into sub-processes to optimize the quality, fill, and deposition rate of the overall electroplated copper layer.

After electrofill on wafer 223 is complete, carousel 101 again rotates counterclockwise to index all of the holder/handling assemblies over their next respective stations, repeating 305. Next comes a fifth sub-process, overburden, 315, at station 117. During overburden, copper is electroplated over the fill layer at sufficient thickness to fully cover low aspect ratio features not filled during the electrofill sub-process. Conditions for overburden are optimized for a higher deposition rate and thus organic additives are not typically used as in the "bottom up" electrofill scenario. Higher concentrations of copper ions are used in the electrolyte, and likewise the anode is configured for field shaping with high current density. Typically, it will be desirable to have a uniform current density over the wafer surface during overburden. Also the electrolyte flow and mass transfer rate are higher so that the copper ion supply is not depleted during overburden. In a typical case, the electrolyte employed in the overburden operation contains between about 20 and 40 g/L copper ion, between about 50 and 200 g/L acid, between about 5 and 500 ppm of suppressor and between about 10 and 150 of ppm accelerator. In some cases where smoothness/brightness of the overburden deposit is not an important parameter, the bath may contain little or no suppressor or accelerators. Preferably, it employs a current density of between about 25 and 80 mA/cm$^2$. In a specific embodiment, overburden takes between about 10 and 200 seconds, more preferably between about 20 and 100 seconds, and most preferably between about 30 and 60 seconds.

Note that in cases where the electrolyte composition is to be different in different stations, these stations should be chemically isolated from one another. This isolation may take the form of separate isolated electrolytic cells for stations with different electrolyte requirements. Alternatively, it may take the form of a polymeric or other membrane separator between adjacent stations. The separator allows certain species (e.g., copper and acid) to pass but effectively prevents other species (e.g., organic additives) from passing. Note that just because certain stations must employ different electrolyte compositions, does not mean that each station must be chemically isolated from the next. Any combination of stations that have common electrolyte requirements may share the same electrolyte (as depicted in FIG. 1).

After overburden on wafer 223 is complete, carousel 101 again rotates counterclockwise to index all of the holder/handling assemblies over their next respective stations, repeating 305. Depending on the desired state of the exiting wafer, the next station may be an edge bevel removal station, a backside etching station, a frontside cleaning station, or a rinse and reclaim station. This station may be a combination of these as well, as disclosed in U.S. Pat. No. 6,309,981 by Mayer et al., issued on Oct. 30, 2001, which is incorporated by reference herein. This station is shown as 317, at station 119. During rinse and reclaim, the objective is to thoroughly rinse the wafer and submersible holder/handler to reduce chemical incursion and corrosion. In some instances, before rinse, a reclaim of electrolyte is performed in which the wafer is spun and the electrolyte collected, or alternatively an air knife is used to remove electrolyte from the wafer surface. Alternatively the electrolyte is reclaimed from the used rinse solution. Preferably during rinse and reclaim, the wafer is vertically disposed over a catch basin or trap to reduce the overall footprint of station 119. Preferably rinse and dry takes between about 10 and 200 seconds, more preferably between about 20 and 100 seconds, and most preferably between about 30 and 60 seconds. Also the angle the wafer is held during rinse and reclaim is preferably between about 0 and 20 degrees from horizontal, more preferably between about 0 and 10 degrees from horizontal. Most preferably between about 0 and 5 degrees from horizontal.

After processing in the sixth module, wafer 223 is complete, carousel 101 again rotates counterclockwise to index all of the holder/handling assemblies over their next respective stations, repeating 305. This action puts wafer 223 again over loading/unloading station 107. Fully-processed wafer 223 is now unloaded, and a new unprocessed wafer is loaded, see 319. During electroplating process 301 on wafer 223, each station is processing its own wafer and throughput is maximized. Since each wafer is exposed to the same processing environment, wafer uniformity is optimized as well.

While the above example pertains to a sequencing or division of an electroplating unit operation (encompassing process) into sub-processes implemented at various stations, the sequencing allowed by this invention can be applied to other wet processing operation employed during integrated circuit fabrication. Examples of other we processing operations include wet etching, electropolishing, rinsing/cleaning, spin coating, electroless plating, activation processes for electroless plating, metal chemical etching or polishing, edge bevel removal, wafer backside rinsing and etching, frontside rinsing and cleaning (e.g. with a dilute acid), and chemical mechanical polishing and the like. For example, for edge bevel removal, a first EBR operation could be employed to remove copper (with a particular set of etchants, edge removal widths, speeds, etc.), followed by a second EBR operation to remove the underlying edge barrier layer, and perhaps a third EBR operation to remove edge dielectric material. A final example is the combination of a spray on coating process for electropolishing (as disclosed in U.S. patent Ser. No. 09/557,695 assigned to Mayer et. al.), followed by electropolishing a wafer in an electropolishing bath.

Figure 4:
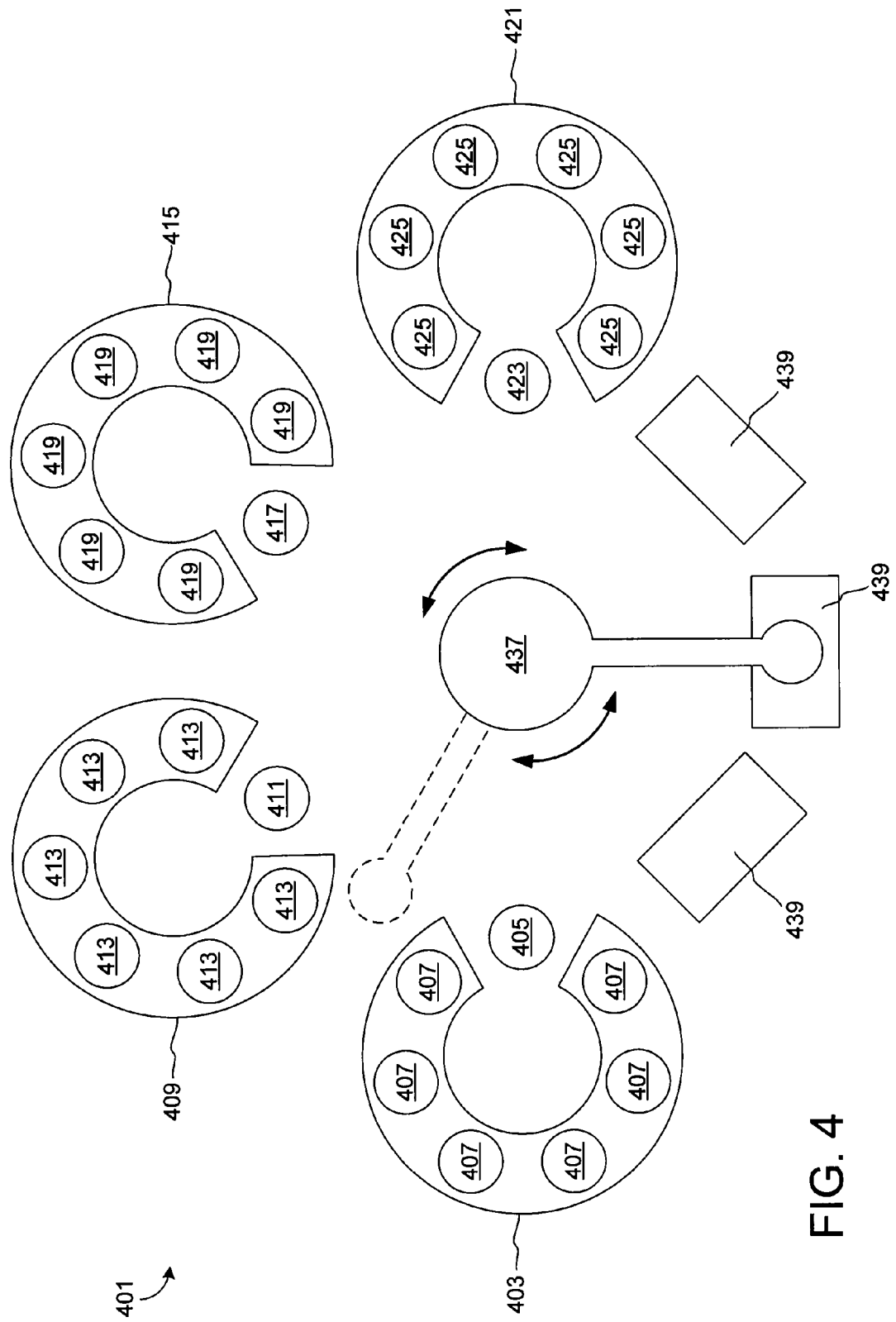
FIG. 4 depicts a cluster arrangement of modules for a particular embodiment of the invention.

Another aspect of the invention is a system in which multiple wafer processing modules are associated in a cluster format. As mentioned above, each module executes a separate wet process (unit operation). At least one of the modules is divided sequentially into discrete stations for executing separate sub-processes. FIG. 4 depicts a system 401 of wafer process modules for a particular embodiment of the invention. System 401 has a cluster arrangement of wafer process module carousels 403, 409, 415, and 421 radially disposed around a central wafer handling robot 437, each module having its own set of sub-process stations 407, 413, 419, and 425, respectively. Included in 401 is a set of system wafer loading/unloading stations 439, as well as module wafer loading/unloading stations 405, 411, 417, and 423. Robot 437 can rotate freely 360° about a central axis as indicated by the double-headed arrows, and can deliver/receive wafers from all loading/unloading stations as indicated by the dotted outline showing the robot's effective reach. As before, the wafer holder/handler assemblies for each module are not shown so as not to obscure the invention.

As mentioned before, the invention can be embodied in alternate architectures, such as linear straight track designs, combinations of carousel and linear designs, and combinations thereof in stacked or non-stacked assemblies. For example, a vertical arrangement of stacked carousel processing modules can provide smaller equipment footprints, shorter handling distance between modules, and gravity-based wafer feed mechanisms. In such stacked systems, a handling robot can itself be of a carousel design, with multiple wafer handlers so that wafers can be shuttled simultaneously to and from stations above and below it. Also, system 401 can have more or less modules than depicted, just as each module can have more or less stations than depicted. Additionally modules of any of the described architectures can be interchanged and replaced as "plug in" units, taking full advantage of the modular design.

Each module performs an encompassing process associated with integrated circuit fabrication, which in turn encompasses multiple sequential sub-processes. A particular wafer is sequentially processed through each module, before being transferred to the next module in the series. Alternatively, depending on the desired outcome, a wafer can be processed through modules in a random sequence. Not only does each set of sub-processes in a particular module make up an encompassing process of that module, but also the set of encompassing processes associated with all the modules can be used to process a wafer through pre-plating, plating, and post-plating events. For example, module 403 is configured as a plating module as described above in another embodiment of the invention. A wafer is moved from a first loading station 439 via 437, to loading station 405 to start the plating process in module 403 (at the same time 437 unloads a finished electroplated wafer from 403, via 405 and subsequently delivers it to 411 and so on). While in module 403, the wafer is processed through wetting, initiation, seed repair, fill, overburden, and rinse/reclaim. Once the wafer returns to station 405 (after sequentially processing through stations 407), it is then unloaded by 437 for delivery to module 409 and so on. A preferred embodiment of the invention has 403 as a plating module, 409 as a post-plating edge bevel removal (EBR) module, 415 as a rapid thermal anneal (RTA) module, and 421 as an electromechanical polishing (EMP) or electroplanarization module. In some cases, a module for reducing copper metal and/or conformal plating is useful before the plating module 403 (e.g. anneal module with hydrogen or an electroless plating module for conformal plating and seed repair). In this modular system design, not only is wafer throughput optimized, but also the overall footprint of equipment necessary for integrated circuit fabrication is minimized.

While this invention has been described in terms of a few preferred embodiments, it should not be limited to the specifics presented above. Many variations on the above-described preferred embodiments may be employed. Therefore, the invention should be broadly interpreted with reference to the following claims.

What is claimed is:

1. An apparatus for processing a semiconductor wafer, the apparatus comprising:
   a cluster tool containing a plurality of separate stations; wherein the plurality of separate stations is configured to perform a plurality of distinct processes; and
   a mechanism for transporting the semiconductor wafer to and from each station of the plurality of separate stations, wherein the plurality of separate stations comprises:
   (a) a wetting station configured for wetting the semiconductor wafer comprising a recessed feature without applying current to the wafer;
   (b) an electrofill station configured at least for receiving the pre-wetted wafer from the wetting station and for filling the recessed feature with a metal; and
   (c) a chemical metal etch station configured for wet metal etching and rinsing etchant from the semiconductor wafer;
   wherein the plurality of separate stations are in a stacked linear format and wherein the mechanism for transporting the semiconductor wafer comprises a first robot which moves the semiconductor wafer between a wafer carrier and the cluster tool, and a second robot which indexes the semiconductor wafer from station to station within the cluster tool.

2. The apparatus of claim 1, wherein the metal is copper.

3. The apparatus of claim 1, wherein the mechanism for transporting the semiconductor wafer comprises a robot arm.

4. The apparatus of claim 1, wherein the wetting station, the electrofill station, and the chemical metal etch station are chemically isolated from each other.

5. The apparatus of claim 1, wherein the cluster tool comprises a modular format.

6. The apparatus of claim 1, wherein the wetting station is further configured to deliver the semiconductor wafer to a wetting solution at a specified angle relative to the surface of the wetting solution.

7. A method of processing a semiconductor wafer having a recessed feature the method comprising:
   (a) providing the wafer having a recessed feature to a wetting station in a cluster tool, said cluster tool containing a plurality of separate stations including an electrofill station and a chemical metal etch station;
   (b) in the wetting station, wetting the wafer without applying current to the wafer;
   (c) transferring the wetted wafer from the wetting station to the electrofill station;
   (d) in the electrofill station, filling the recessed feature with copper;
   (e) transferring the wafer to the chemical metal etch station;
   (f) in the chemical metal etch station, wet etching copper from the wafer and rinsing the wet etchant from the wafer, wherein the plurality of separate stations are in a stacked linear or in a stacked carousel format and wherein an apparatus comprising the cluster tool comprises a mechanism for transporting the semiconductor wafer, said mechanism comprising a first robot which moves the semiconductor wafer between a wafer carrier and the cluster tool, and a second robot which indexes the semiconductor wafer from station to station within the cluster tool.

8. The method of claim 7, wherein the wetting station, the electrofill station, and the chemical metal etch station are chemically isolated from each other.

9. The method of claim 7, wherein the cluster tool comprises a modular format.

10. The method of claim 7, wherein the wetting station is further configured to deliver the semiconductor wafer to a wetting solution at a specified angle relative to the surface of the wetting solution.

11. An apparatus for processing a semiconductor wafer, the apparatus comprising:
    a cluster tool containing a plurality of separate stations; wherein the plurality of separate stations is configured to perform a plurality of distinct processes; and a mechanism for transporting the semiconductor wafer to and from each station of the plurality of separate stations, wherein the plurality of separate stations comprises:
- (a) a wetting station configured for wetting the semiconductor wafer comprising a recessed feature without applying current to the wafer;
- (b) an electrofill station configured at least for receiving the pre-wetted wafer from the wetting station and for filling the recessed feature with a metal; and
- (c) a chemical metal etch station configured for wet metal etching and rinsing etchant from the semiconductor wafer; wherein the plurality of separate stations are in a stacked carousel format and wherein the mechanism for transporting the semiconductor wafer comprises a first robot which moves the semiconductor wafer between a wafer carrier and the cluster tool, and a second robot which indexes the semiconductor wafer from station to station within the cluster tool.

12. The apparatus of claim 11, wherein the metal is copper.

13. The apparatus of claim 11, wherein the mechanism for transporting the semiconductor wafer comprises a robot arm.

14. The apparatus of claim 11, wherein the wetting station, the electrofill station, and the chemical metal etch station are chemically isolated from each other.

15. The apparatus of claim 11, wherein the cluster tool comprises a modular format.

16. The apparatus of claim 11, wherein the wetting station is further configured to deliver the semiconductor wafer to a wetting solution at a specified angle relative to the surface of the wetting solution.

* * * * *